United States Patent
Park

(10) Patent No.: US 7,553,759 B2
(45) Date of Patent: Jun. 30, 2009

(54) SEMICONDUCTOR DEVICE AND METHOD OF MANUFACTURING A SEMICONDUCTOR DEVICE

(75) Inventor: Hyuk Park, Gyeonggi-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 4 days.

(21) Appl. No.: 11/567,671

(22) Filed: Dec. 6, 2006

(65) Prior Publication Data
US 2007/0132101 A1 Jun. 14, 2007

(30) Foreign Application Priority Data
Dec. 14, 2005 (KR) .................. 10-2005-0123315

(51) Int. Cl.
*H01L 21/4763* (2006.01)
(52) U.S. Cl. .................. 438/634; 438/624; 438/627; 438/637; 257/E21.597; 257/E21.576
(58) Field of Classification Search ........... 438/623, 438/624, 627, 634, 637; 257/E21.597, E21.576
See application file for complete search history.

(56) References Cited

U.S. PATENT DOCUMENTS

| | | | |
|---|---|---|---|
| 6,319,821 B1 * | 11/2001 | Liu et al. ................ | 438/636 |
| 6,417,112 B1 * | 7/2002 | Peyne et al. ............. | 438/754 |
| 6,787,446 B2 * | 9/2004 | Enomoto et al. ......... | 438/623 |
| 6,800,548 B2 * | 10/2004 | Andideh ................. | 438/627 |
| 7,365,021 B2 * | 4/2008 | Kim et al. .............. | 438/745 |
| 2004/0161924 A1 * | 8/2004 | Chen et al. ............. | 438/637 |

* cited by examiner

*Primary Examiner*—Alexander G Ghyka
*Assistant Examiner*—Seahvosh J Nikmanesh
(74) *Attorney, Agent, or Firm*—Sherr & Vaughn, PLLC

(57) ABSTRACT

A semiconductor device may include the following. A diffusion barrier formed over a semiconductor substrate having a conductive layer. An etching stop layer formed over a diffusion barrier. Inter-metal dielectric (IMD) layers (e.g. having via holes formed over an etching stop layer and trenches wider than the via holes). Metal interconnections that fill via holes and trenches. Via holes in IMD layers may pass through a diffusion barrier and an etching stop layer to connect to a conductive layer in a semiconductor substrate.

10 Claims, 10 Drawing Sheets

SEMICONDUCTOR DEVICE AND METHOD OF MANUFACTURING A SEMICONDUCTOR DEVICE

The present application claims priority under 35 U.S.C. 119 and 35 U.S.C. 365 to Korean Patent Application No. 10-2005-0123315 (filed on Dec. 14, 2005), which is hereby incorporated by reference in its entirety.

BACKGROUND

Metal interconnections of semiconductor devices may connect circuits formed in a semiconductor substrate. Circuits may be connected through electrical connections and/or pad connections between semiconductor devices. Connections may include metal thin films (e.g. aluminum, aluminum alloys, and/or copper). Critical dimensions (CD) of interconnections may be relatively small in highly integrated devices. A damascene process may be used to form metal interconnections having a micro pattern.

To form a metal interconnection, a diffusion barrier may be formed over a semiconductor layer. A diffusion barrier may include a conductive layer. An inter-metal dielectric (IMD) layer may be formed over a diffusion barrier. A via hole pattern may be formed in an IMD layer. A via hole pattern may be formed using a photoresist layer to pattern a IMD layer. A via hole may be filled with a photoresist layer and a recess process may be performed. A trench pattern may be etched in the IMD layer using a photoresist layer as a mask. A photoresist layer and a trench pattern that fill a via hole may be removed. A cleaning process of removing particles that remain in a via hole and a trench may be performed. A via hole and a trench may be filled with copper.

A metal interconnection may have multi-layer structure. A diffusion barrier may prevent a lower copper metal interconnection from diffusing into an upper IMD layer when a process of forming the upper copper metal interconnection is performed. A diffusion barrier may be formed to have a thickness greater than about 300 Å.

However, a diffusion barrier may be affected by a process of removing a photoresist layer that fills a via hole. If a via hole is non-uniformly etched, a lower copper metal interconnection may be exposed to the air during a cleaning process. If a lower copper metal interconnection is exposed to air, it may be corroded. Corrosion may degrade electrical characteristics, which may degrade the reliability of a semiconductor device.

SUMMARY

Embodiments relate to a semiconductor device that may prevent a metal interconnection from being exposed to the air. In embodiments, corrosion may be avoided, preventing degradation of electrical characteristic and reliability of a semiconductor device.

In embodiments, a semiconductor device includes: a diffusion barrier formed over a semiconductor substrate having a conductive layer; an etching stop layer formed over a diffusion barrier; inter-metal dielectric (IMD) layers (e.g. having via holes formed over an etching stop layer and trenches wider than the via holes); and metal interconnections that fill via holes and trenches. Via holes in IMD layers may pass through a diffusion barrier and an etching stop layer to connect to a conductive layer in a semiconductor substrate. In embodiments, a diffusion barrier may include SiOF. In embodiments, a diffusion barrier may have a thickness of about 400 Å to about 500 Å.

Embodiments relate to a method of manufacturing a semiconductor device. A method may include: forming a diffusion barrier (e.g. including SiN) over a semiconductor substrate having a conductive layer; forming an etching stop layer (e.g. including SiOF) over a diffusion barrier; forming IMD layers over an etching stop layer; forming via hole patterns in IMD layers; patterning IMD layers using via hole patterns as masks to form via holes that expose an etching stop layer; forming trench patterns in IMD layers; patterning IMD layers using trench patterns as masks to form trenches (e.g. trenches wider than via holes); cleaning the walls of via holes and trenches; removing etched etching stop layer; and removing an etched diffusion barrier. In embodiments, an etching stop layer may serve as an etching stop point in via hole formation.

BRIEF DESCRIPTION OF DRAWINGS

Example

DETAILED DESCRIPTION

Figure 1:
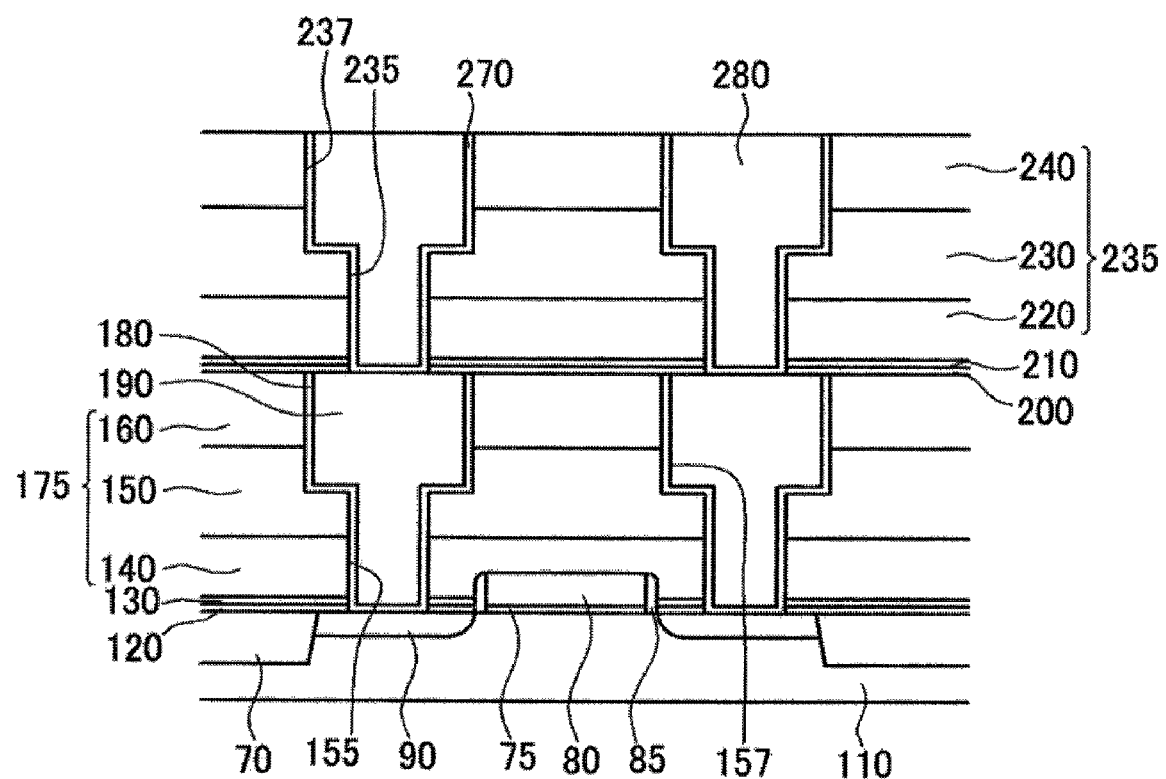
FIGS. 1 to 10 illustrate processes of manufacturing semiconductor devices, according to embodiments.

In figures, thickness of layers and areas will be enlarged for the purpose of clarity, and the same reference numerals will be used to refer to the same elements throughout the description. When layers, films, areas and plates are expressed as they are formed on other elements, it may not exclude another elements interposed therebetween. In contrast, if elements are expressed as they are directly formed on other elements, it may exclude another elements interposed therebetween.

Example FIG. 1 illustrates the structure of a semiconductor device, according to embodiments. As illustrated in FIG. 1, gate insulating layer 75 and gate electrode 80 may be sequentially formed over semiconductor substrate 110. Isolation layer 70 and high density conjunction region 90 may be formed in semiconductor substrate 110. Spacers 85 may be formed at the sides of gate insulating layer 75 and gate electrode 80. Lower diffusion barrier 120 and lower etching stop layer 130 may be sequentially formed over exposed semiconductor substrate 110. Lower inter-metal dielectric (IMD) layers 175 may include lower via holes 155. Lower trenches 157 may be formed in IMD layers over lower etching stop layer 130, spacers 85, and gate electrode 80.

Lower barrier layers 180 may be formed over walls of lower via holes 155 and low trenches 157. Lower metal interconnections 190 may fill lower via holes 155 and lower trenches 157 over lower barrier layers 180. Upper diffusion barrier 200 and upper etching stop layer 210 may be sequentially formed over semiconductor substrate 110. Upper IMD layers 235 may include upper via holes 235 and upper trenches 237. Upper barrier layers 270 may be formed on the walls of upper via holes 235 and upper trenches 237. Upper metal interconnections 280 may fill upper via holes 235 and upper trenches 237. Upper via holes 235 and upper trenches 237 may be formed over upper barrier layers 270. Lower IMD layer 175 may include at least one of first silane layer 140, lower fluoride-doped silicate glass layer 150, and/or second silane layer 160. Upper IDM layer 235 may include at least one of third silane layer 220, upper FSG layer 230, and fourth silane layer 240.

Figure 2:
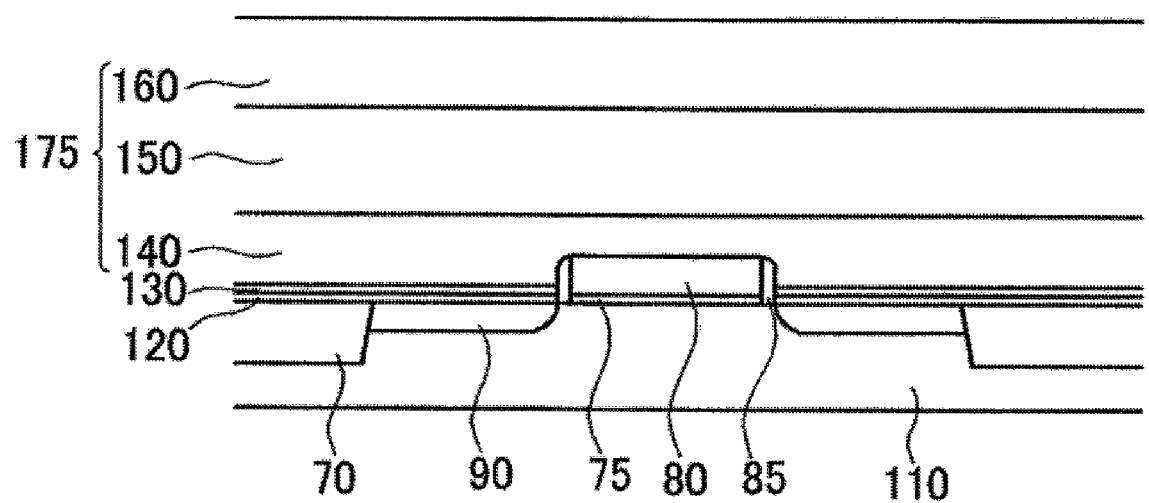

FIGS. 2 to 10 illustrate processes of manufacturing a semiconductor device, according to embodiments. As illustrated in FIG. 2, gate insulating layer 75 and gate electrode 80 may be sequentially formed over semiconductor substrate 110. Semiconductor substrate 100 may include device isolation layer 70 and high density conjunction region 90. Spacers 85 may be formed on the sides of gate insulating layer 75 and gate electrode 80. Lower diffusion barrier 120 may be formed over semiconductor substrate 110. Lower etching stop layer 130 may be formed over lower diffusion barrier 120. Lower IMD layers 175 may be formed over at least one of lower etching stop layer 130, spacers 85, and/or gate electrode 80. Lower etching stop layer 130 may include SiOF, which may have a low dielectric constant k. Lower etching stop layer 130 may have a thickness of about 400 Å to about 500 Å. Lower IMD layer 175 may include first silane layer 140, lower FSG layer 150, and second silane layer 160.

Figure 3:
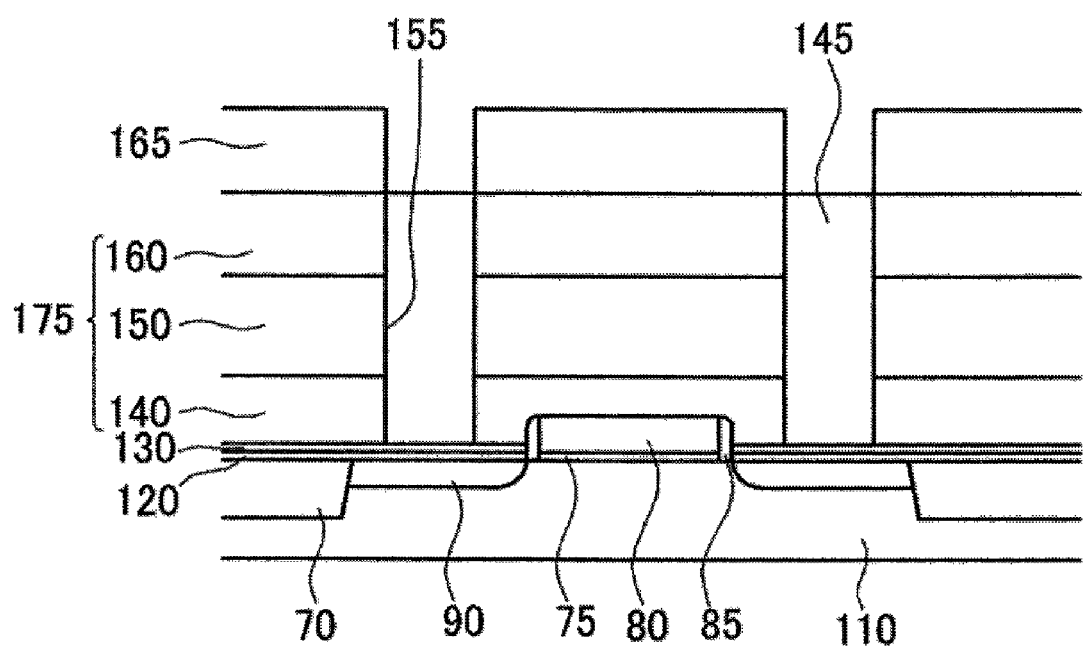

As illustrated in FIG. 3, photoresist layer 165 with lower via hole patterns may be formed over lower IMD layers 175. Lower IMD layers 175 may be etched (e.g. using photoresist layer 165 as a mask) to form lower via holes 155. Lower via holes 155 may expose lower etching stop layer 130. Lower etching stop layer 130 may be an etching stop point. Lower via holes 155 may be filled with lower via filling layers 145. Filling layers 145 may be formed of novolac and/or barc.

Figure 4:
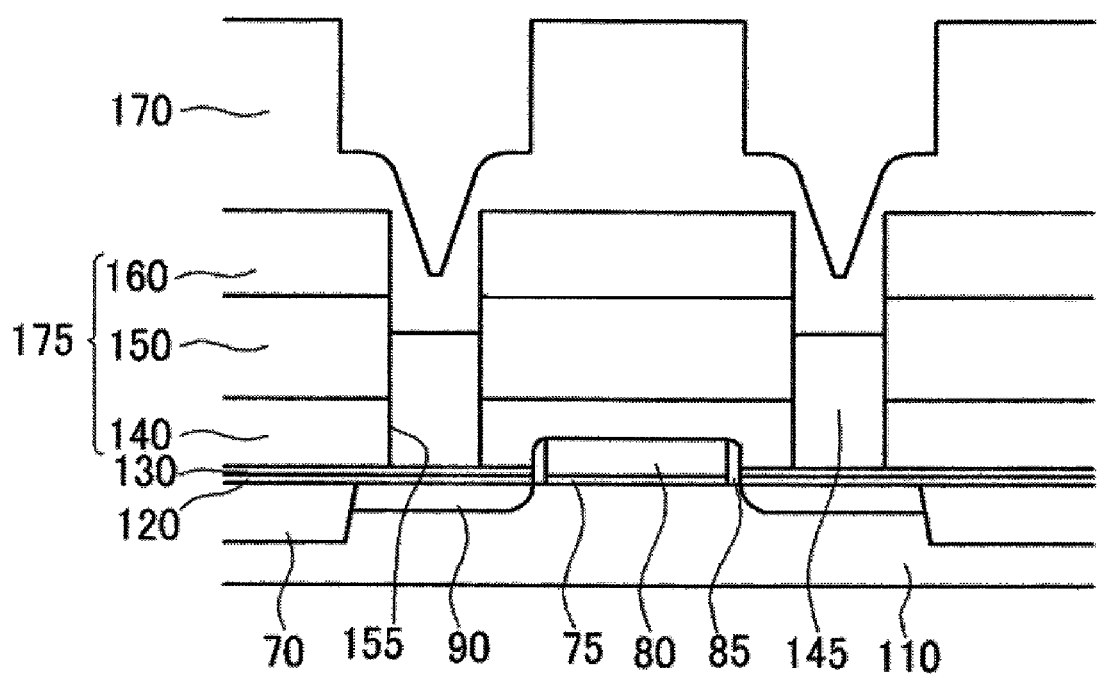

As illustrated in FIG. 4, a recess process may remove ⅓ to ½ of lower via filling layers 145. Lower trench patterns 170 may be formed of a photoresist layer over lower IMD layers 175 and lower via filling layers 145.

Figure 5:
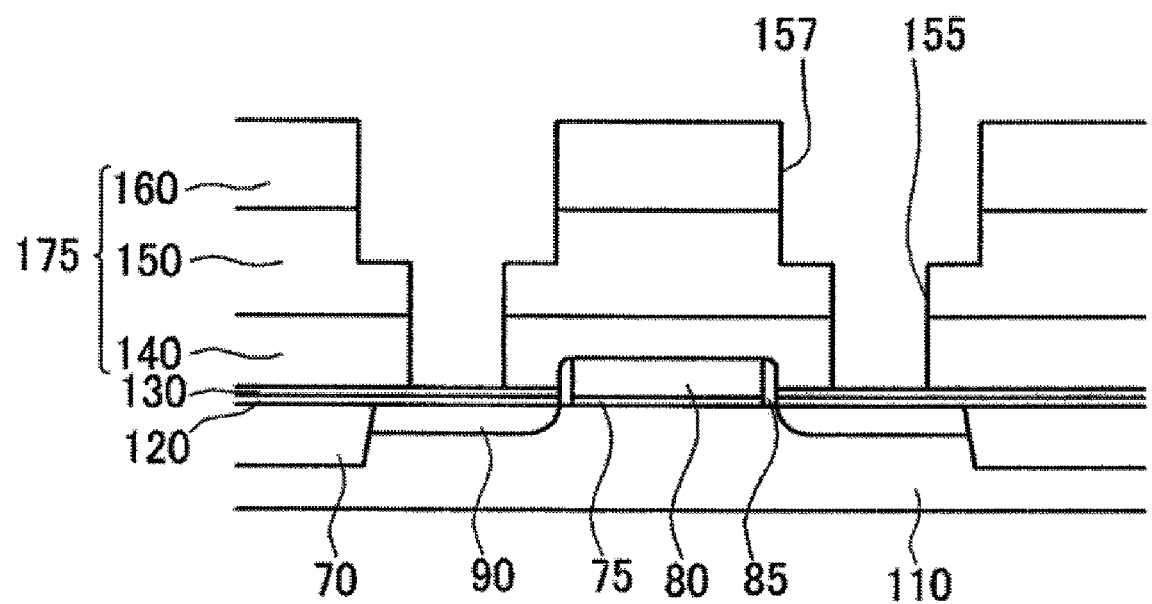

As illustrated in FIG. 5, lower IMD layers 175 may be etched using lower trench patterns 170 as masks to form trenches 157. Lower trench patterns 170 may be removed. Lower via filling layers 145 may be removed to expose lower etching stop layer 130. A cleaning process may remove particles (that remain from an etching process) from the walls of lower trenches 157 and lower via holes 155. At least a portion of lower etching stop layer 130 may be lost by a cleaning process. Lower diffusion barrier 120 may be protected from a cleaning process by lower etching stop layer 130, so that lower diffusion barrier 120 is not etched.

Figure 6:
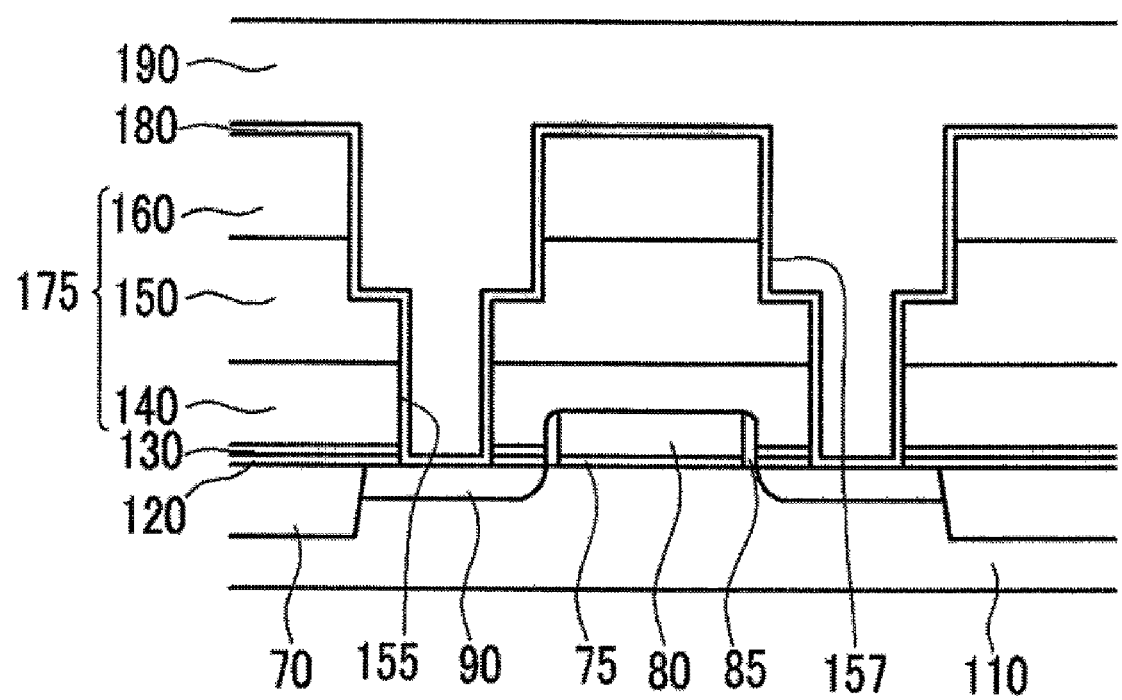

As illustrated in FIG. 6, lower etching stop layer 130 and lower diffusion stop layer 120 may be removed. Lower barrier layers 180 may be formed over lower IMD layers 175 and over the walls of lower trenches 157 and lower via holes 155. Lower metal thin layer 190 may be formed over lower barrier layers 180.

Figure 7:
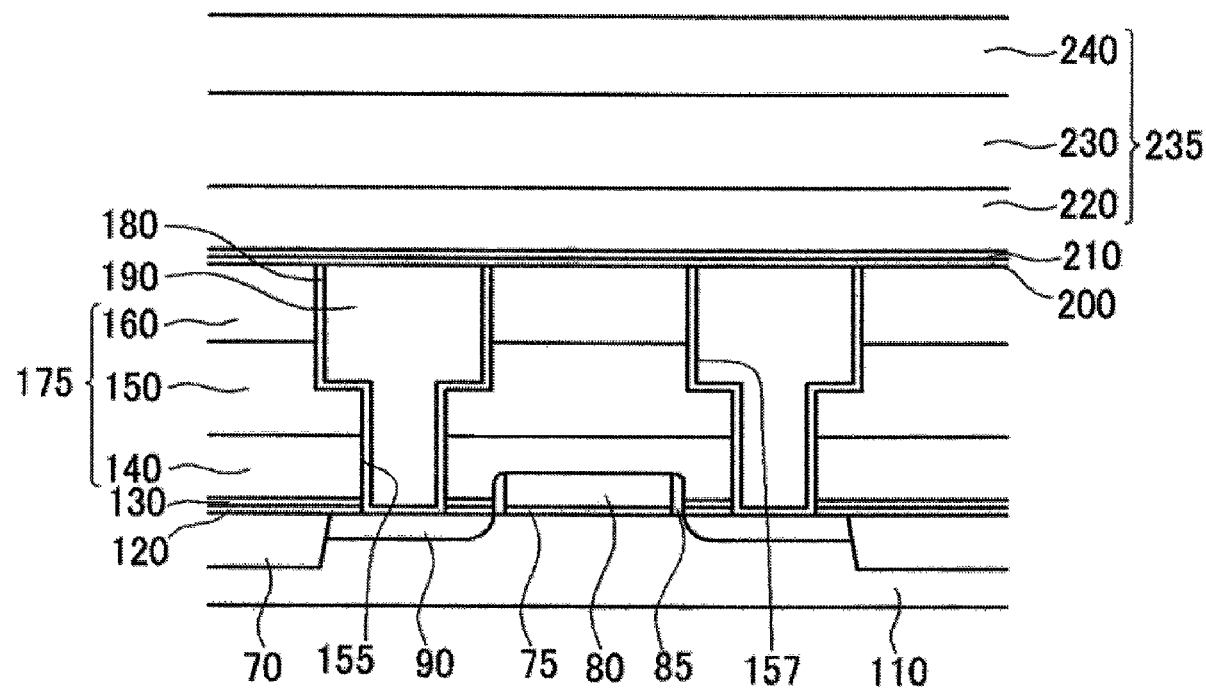

As illustrated in FIG. 7, a chemical mechanical polishing (CMP) process may be performed on lower barrier layers 180 and lower metal thin layer 190 to form lower metal interconnections 191. Upper diffusion barrier 200, upper etching stop layer 210, and upper IMD layers 235 may be sequentially formed over lower IMD layers 175 and lower metal interconnections 191. In embodiments, upper etching stop layer 210 may be formed of a SiOF layer having a low dielectric constant k. In embodiments, upper etching stop layer 210 may have a thickness of about 400 Å to about 500 Å. Upper IMD layer 235 may comprise at least one of third silane layer 220, upper FSG layer 230, and/or fourth silane layer 240.

Figure 8:
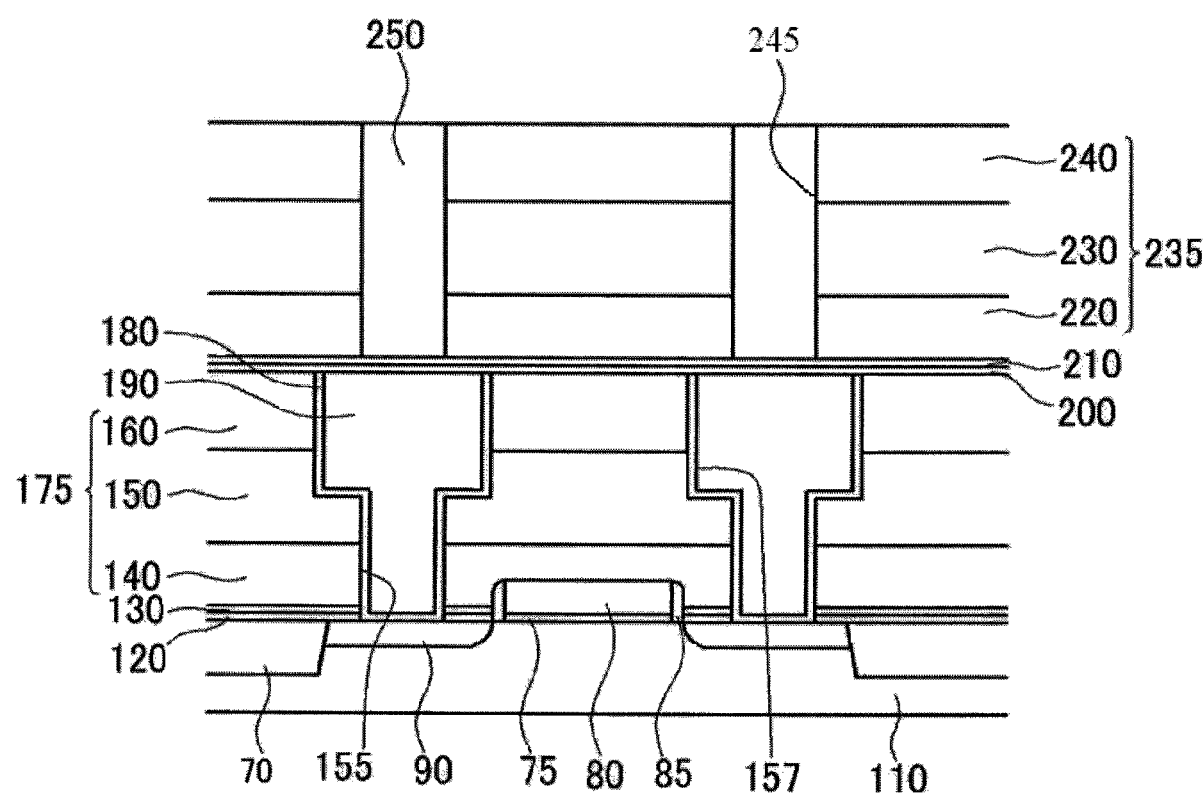
Figure 9:
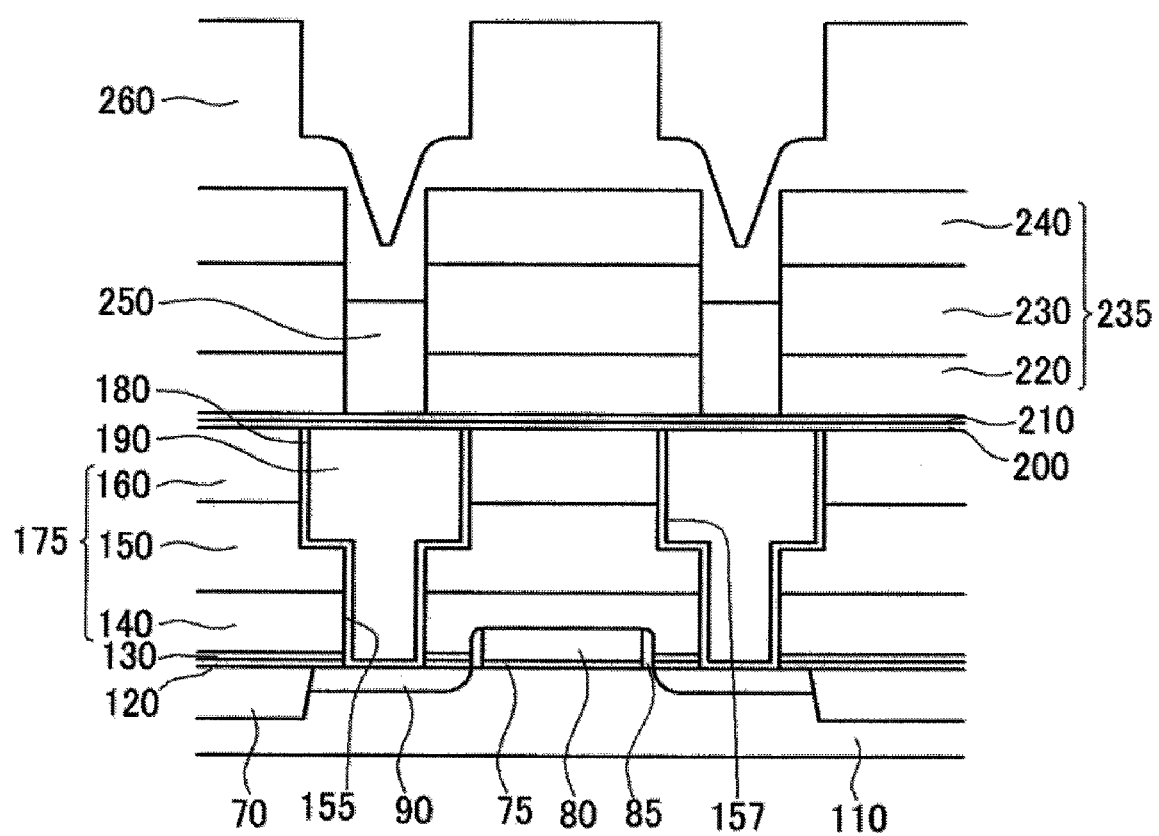

As illustrated in FIG. 8, upper IMD layers 235 may be patterned to form upper via holes 245. Upper via holes 245 may expose upper etching stop layer 210. Upper via holes 235 may be filled with upper filling layers 250. Upper filling layers 250 may include at least one of novolac or barc. As illustrated in FIG. 9, a process may remove about ⅓ to ½ of upper via filling layers 250. Upper trench patterns 260 may be formed of a photoresist layer formed over upper IMD layers 235 and upper filling layers 250.

Figure 10:
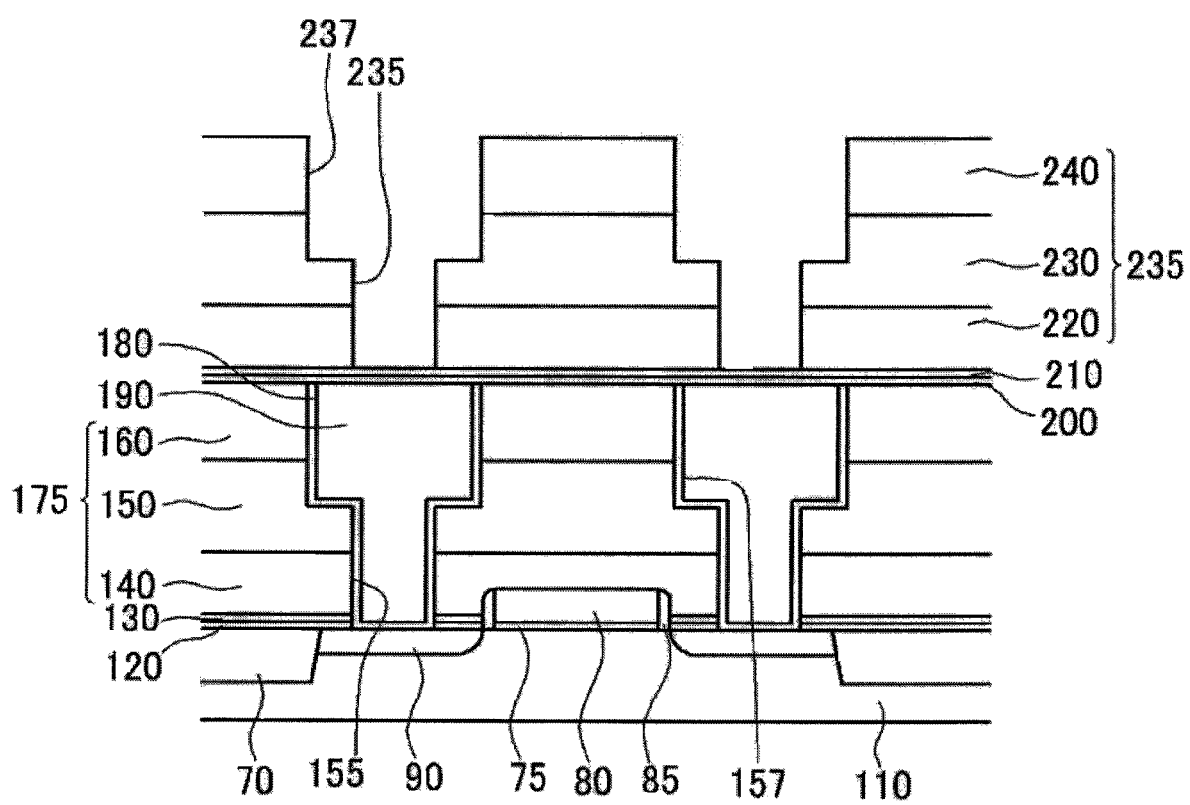

As illustrated in FIG. 10, upper IMD layers 235 may be etched using upper trench patterns 260 as a mask to form upper trenches 237. Upper trench patterns 260 and/or upper via filling layers 250 may be removed to expose upper etching stop layer 210. A cleaning process may be performed to remove particles (that remain from an etching process) on the walls of upper trenches 237 and upper via holes 235. A portion of upper etching stop layer 210 may be lost by a cleaning process. Since at least a portion of upper etching stop layer 210 may remain from a cleaning process, upper diffusion barrier 200 may be protected from a cleaning process by upper etching stop layer 210.

As illustrated in FIG. 1, exposed portions of upper etching stop layer 210 and upper diffusion barrier 200 may be removed. Upper barrier layers 270 may be formed on the walls of upper trenches 237 and via holes 235. A metal layer may be formed over upper barrier layers 270. A CMP process may be performed on a metal layer to form upper metal interconnections 280.

In embodiments, since upper etching stop layer 210 is formed over upper diffusion stop layer 200, upper diffusion barrier 200 is protected from removal. In embodiments, since upper diffusion barrier 200 is protected from removal, corrosion of metal thin layer 190 is prevented. In embodiments, prevention of corrosion of metal thin layer 190 may improve electrical characteristic and reliability of a semiconductor device.

In embodiments, in order to form multi-layered metal interconnections, a diffusion barrier, an etching stop layer, and a metal IMD layers are sequentially arranged over a semiconductor substrate. A semiconductor substrate may include a conductive layer. A conductive layer may be protected from corrosion by a diffusion barrier and/or an etching stop layer during removal of trench and via filling layers. A diffusion barrier may have a thickness less than about 300 Å, according to embodiments. Corrosion of a conductive layer may be prevented by preventing the conductive layer from being exposed to air, according to embodiments. In embodiments, electrical characteristic and reliability of a semiconductor device may be improved.

It will be apparent to those skilled in the art that various modifications and variations can be made to embodiments. Thus, it is intended that embodiments cover modifications and variations thereof within the scope of the appended claims.

What is claimed:

1. A method comprising:
   forming a diffusion barrier directly on a conductive layer; and
   forming an etching stop layer directly on the diffusion barrier, wherein the etching stop layer comprises SiOF; and
   forming at least one dielectric layer over the etching stop layer, wherein the at least one dielectric layer comprise a first silane layer formed directly on the etching stop layer, a FSG layer formed directly on the first silane layer and a second silane layer formed directly on the FSG layer; and
   forming a via hole and a trench in the at least one dielectric layer to expose the etching stop layer;
   cleaning the walls of the via hole and the trench; and then
   removing the exposed portions of the etching stop layer and the diffusion barrier to expose the conductive layer.

2. The method of claim 1, wherein the diffusion barrier comprises SiN.

3. The method of claim 1, wherein the conductive layer is formed in a semiconductor substrate.

4. The method of claim 1, wherein the conductive layer is formed in a dielectric layer.

5. The method of claim 1, wherein the etching stop layer is an etching stop point during formation of the via hole.

6. A method comprising:
   forming a diffusion barrier directly on a semiconductor substrate; and then forming an etching stop layer directly on the diffusion barrier, wherein the etching stop layer comprises a low dielectric material comprising SiOF; and then forming a plurality of IMD layers over the semiconductor substrate including the etching stop layer, wherein the IMD layers comprise a first silane layer formed over the etching stop layer, a FSG layer formed over the first silane layer and a second silane layer formed over the FSG layer; and then forming a via hole in the plurality of IMD layers to expose the etching stop layer; and then forming a trench pattern over the IMD layers; and then forming a trench by etching the IMD layers using the trench pattern as a mask; and then removing the trench pattern; and then removing exposed portions of the etching stop layer and the diffusion barrier layer in the via hole to expose the conductive layer.

7. The method of claim 6, wherein forming the via holes comprises:

forming a photoresist layer having via hole patterns over the IMD layers; and then etching the IMD layers using the photoresist layer as a mask.

8. The method of claim 6, wherein the trench pattern comprises a photoresist layer.

9. The method of claim 6, further comprising, after removing the trench pattern and before removing the exposed portions of the etching stop layer and the diffusion barrier layer:

performing a cleaning process on the walls of the trench and the via hole.

10. A method comprising:

sequentially forming a diffusion barrier and an etching stop layer over a conductive layer, wherein the etching stop layer comprises SiOF;

forming an IMD layer directly on the etching stop layer, wherein the IMD layer comprises a first silane layer formed over the etching stop layer, a FSG layer formed over the first silane layer and a second silane layer formed over the FSG layer;

forming a via hole in the IMD layer to expose the etching stop layer;

forming a via filling layer in the via hole;

removing a portion of the via filling layer;

forming a trench pattern over the IMD layer and the via filling layer;

forming a trench by etching the IMD layer using the trench pattern as a mask;

removing the trench pattern;

removing the remaining portion of the via filling layer to expose the etching stop layer;

cleaning the walls of the trench and the via hole; and then exposing the conductive layer by removing exposed portions of the etching stop layer and the diffusion barrier layer in the via hole.

* * * * *